United States Patent
Raab

(10) Patent No.: US 6,300,254 B1
(45) Date of Patent: Oct. 9, 2001

(54) METHODS OF MAKING COMPLIANT INTERFACES AND MICROELECTRONIC PACKAGES USING SAME

(75) Inventor: Kurt Raab, Phoenix, AZ (US)

(73) Assignee: Tessera, Inc., San Jose, CA (US)

(*) Notice: Subject to any disclaimer, the term of this patent is extended or adjusted under 35 U.S.C. 154(b) by 0 days.

(21) Appl. No.: 09/293,005

(22) Filed: Apr. 16, 1999

Related U.S. Application Data
(60) Provisional application No. 60/082,193, filed on Apr. 17, 1998.

(51) Int. Cl.$^7$ ............ H01L 21/44; H01L 21/48; H01L 21/50; H01L 21/31; H01L 21/469
(52) U.S. Cl. .......................... 438/778; 438/117
(58) Field of Search .................. 438/117, 778; 264/5, 614, 645, 638, 603

(56) References Cited

U.S. PATENT DOCUMENTS

| | | | |
|---|---|---|---|
| 5,148,265 | 9/1992 | Khandros et al. | 357/80 |
| 5,148,266 | 9/1992 | Khandros et al. | 357/80 |
| 5,477,611 | 12/1995 | Sweis et al. | 29/840 |
| 5,547,530 | * 8/1996 | Nakamura | 156/89 |
| 5,548,091 | 8/1996 | DiStefano et al. | 174/260 |
| 5,659,952 | 8/1997 | Kovac et al. | 29/840 |
| 5,663,106 | 9/1997 | Karavakis et al. | 29/841 |
| 5,915,170 | * 6/1999 | Raab et al. | 438/118 |

* cited by examiner

Primary Examiner—Charles Bowers
Assistant Examiner—Nema Berezny
(74) Attorney, Agent, or Firm—Lerner, David, Littenberg, Krumholz & Mentlik, LLP

(57) ABSTRACT

A method of making a compliant interface includes providing a support structure and forming a plurality of compliant pads on the support structure by moving a sheet or mold having apertures toward a layer of flowable composition disposed on the support structure. A method of making a microelectronic package includes juxtaposing a microelectronic element with the compliant interface. Leads are formed between the microelectronic element and the substrate. An encapsulant may be disposed between the microelectronic element and the substrate.

43 Claims, 4 Drawing Sheets

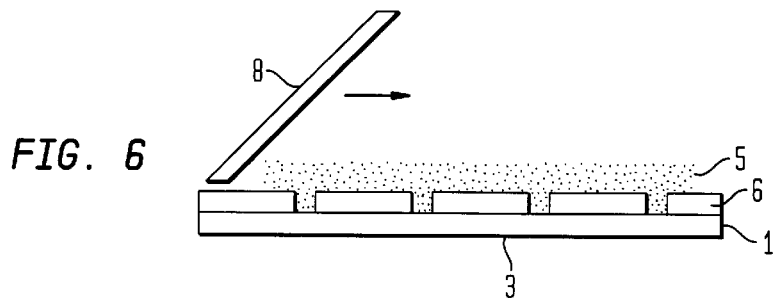
FIG. 6
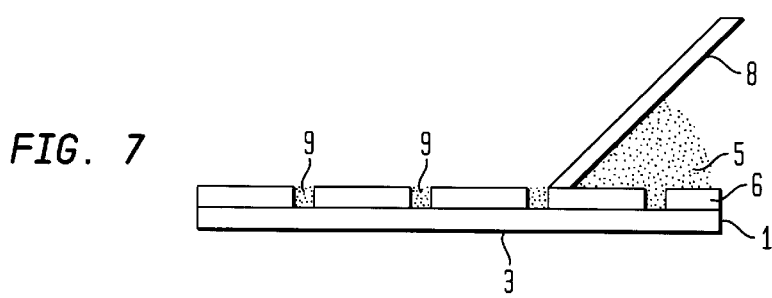
FIG. 7
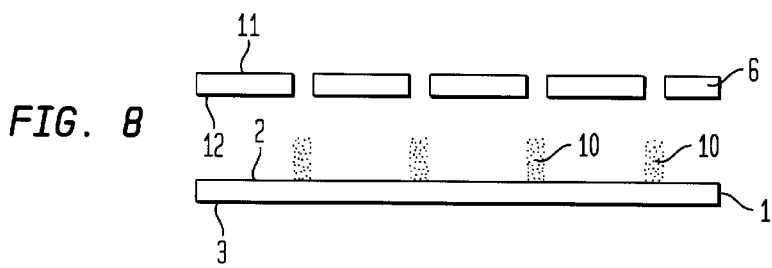
FIG. 8
FIG. 9
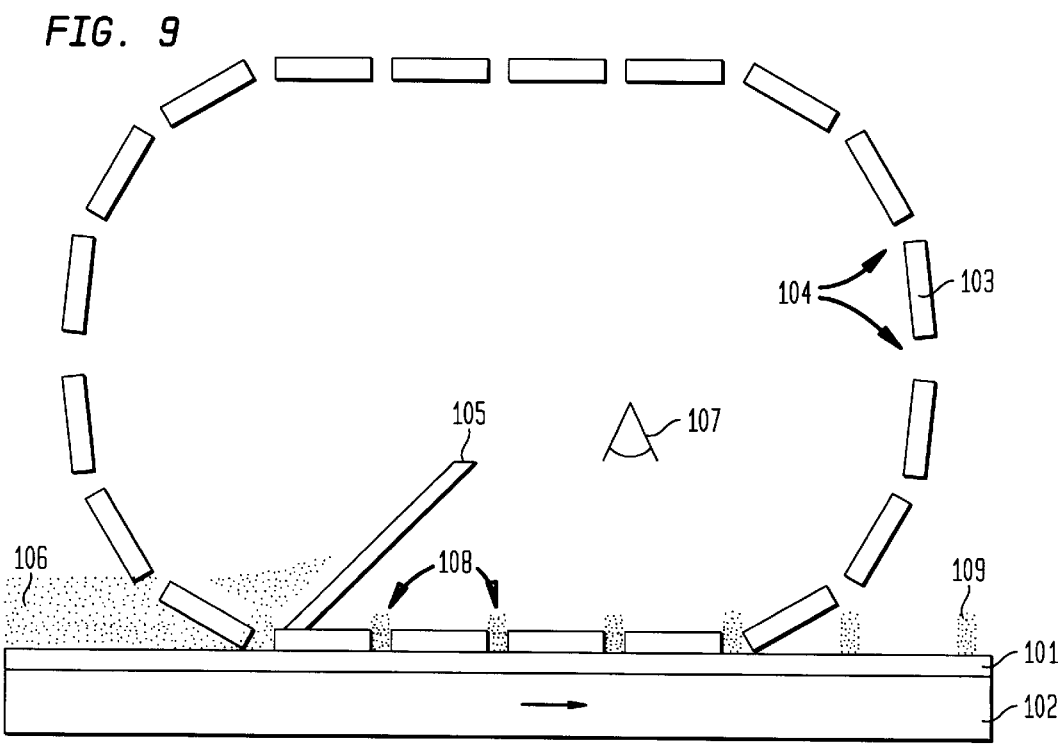

METHODS OF MAKING COMPLIANT INTERFACES AND MICROELECTRONIC PACKAGES USING SAME

CROSS REFERENCE TO RELATED APPLICATIONS

The present application claims benefit of U.S. Provisional Patent Application Ser. No. 60/082,193 filed on Apr. 17, 1998, the disclosure of which is hereby incorporated herein by reference.

FIELD OF THE INVENTION

The present invention relates to the field of microelectronic packaging and methods of making the same and more particularly relates to methods of making connection components and compliant interfaces for microelectronic packages.

BACKGROUND OF THE INVENTION

Semiconductor chip manufactures and packagers sometimes use ball grid arrays ("BGAs") to interconnect semiconductor chips to external circuits such as printed circuit boards. Using BGA technology, a semiconductor chip is connected to a printed circuit board using solder connections. When solder alone is used to interconnect the contacts on the semiconductor chip to the printed circuit board, the solder columns are typically short in order to maintain the structural integrity of the solder column. As a result, the solder columns have minimal elastic properties and are susceptible to solder cracking due to mechanical stress that result from differences in the coefficients of thermal expansion ("CTE") of the chip and the printed circuit board. When the chip heats up during use, both the chip and printed circuit board expand but at different rates and by different amounts. The chip and the board tend to cool down when the chip is not in operation. As the chip and the board cool, both tend to contract but at different rates and by different amounts. This time-wise and amount-wise variation in expansion and contraction stresses the interconnections between the chip and the printed circuit board.

Several inventions commonly assigned to the assignee of the present invention deal effectively, but differently, with this thermal cycling problem. Such inventions include U.S. Pat. Nos. 5,148,265; 5,148,266; 5,477,611; 5,548,091; 5,663,106; and 5,659,952; and U.S. patent applications with Ser. No. 08/987,720 (filed on Jun. 20, 1997); Ser. No. 08/842,313 (filed on Apr. 24, 1997); and Ser. No. 08/931,680 (filed on Sep. 16, 1997). The specifications of all of the above listed patent and patent applications are incorporated by reference herein. Despite the positive results of the aforementioned commonly owned inventions, still further improvements would be desirable.

SUMMARY OF THE INVENTION

The present invention relates to methods of making a compliant interface for use in microelectronic packages. The method of this aspect of the present invention includes providing a support structure and forming a plurality of compliant pads on the support structure using a stamping or molding process. In one preferred embodiment, the support structure includes a circuitized dielectric layer. In another preferred embodiment, the support structure is a release layer.

The present invention also relates to methods of making a microelectronic package using the compliant interface of the present invention. In one aspect of the present method, a compliant interface comprising a circuitized dielectric layer and a plurality of compliant pads is provided. A microelectronic element, such as a semiconductor chip or a wafer, is connected to circuitized dielectric layer by forming leads connecting terminals on the circuitized dielectric layer with contacts on the microelectronic element. In preferred embodiments, an encapsulant composition is then disposed between the dielectric layer and the microelectronic element and around the compliant pads. The encapsulant composition may then be cured to form a cured encapsulant. The cured encapsulant and the compliant pads form a compliant layer disposed between the microelectronic element and the circuitized dielectric layer.

In another aspect of the present method, a compliant interface comprising a release layer and a plurality of compliant pads is provided. The compliant pads are transferred from the release layer to a surface of a circuitized dielectric substrate. In preferred embodiments, the circuitized dielectric substrate is a flexible but substantially inextensible dielectric film. A microelectronic element is connected to the circuitized dielectric substrate by forming leads between terminals on the dielectric substrate and contacts on the microelectronic element. In preferred embodiments, an encapsulant composition is then disposed between the dielectric substrate and the microelectronic element and around the leads. The encapsulant composition is then cured to form, together with the compliant pads, a compliant layer between the microelectronic element and the circuitized dielectric layer.

BRIEF DESCRIPTION OF THE DRAWINGS

FIGS. 1–8 are side views of the progressive steps in one embodiment of the method of the present invention.

FIG. 9 is a side view of an apparatus for use in one embodiment of the present invention.

DETAILED DESCRIPTION OF THE PREFERRED EMBODIMENTS

The present invention provides a method of making a compliant interface for a microelectronic package. Such compliant interfaces can be used to accommodate for the typically large thermal expansion mismatch between a microelectronic element, such as a semiconductor chip or wafer, within the microelectronic package, and an external circuit, such as for example, a printed circuit card, board or panel.

Figure 1:
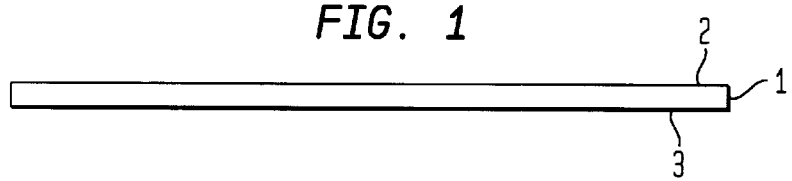
Figure 2:
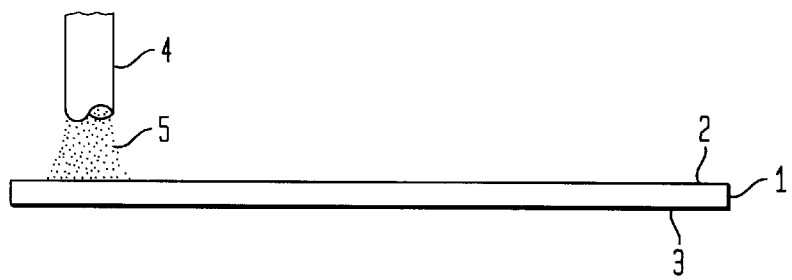

FIGS. 1–8 are side views of progressive steps in the method of one embodiment of the present invention for fabricating a compliant interface for a microelectronic package. As depicted in FIG. 1, the method includes the step of providing a support structure 1 having a face surface 2 and a back surface 3. In preferred embodiments, the support structure is a circuitized dielectric layer, a release layer, or an elastomer layer. If the support structure is a circuitized dielectric layer, such circuitized dielectric layer is preferably a flexible, but substantially inextensible, dielectric film. In preferred embodiments, the dielectric film is a polyimide film, such as for example, Dupont's Kapton™ E. As depicted in FIG. 2, a liquid or flowable composition 5 is dispensed onto support structure 1 using, for example, dispense needle 4. Other methods of disposing the flowable composition, such as for example, pouring, roll applying, brushing, pressure dispensing, or vacuum dispensing may also be used. In preferred embodiments, the flowable composition is curable to an elastomer. In more preferred embodiments, the elastomer is a silicone or a flexiblized epoxy. Although flowable compositions which cure via any cure mechanism may used, flowable compositions which cure by exposure to elevated temperatures are preferred.

Figure 3:
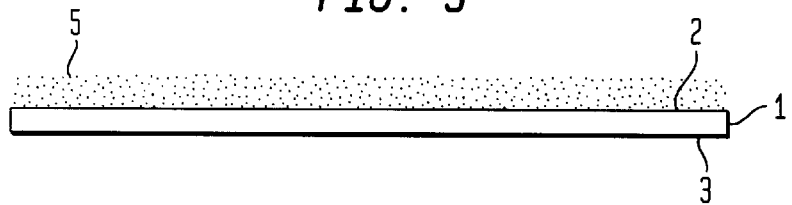

As depicted in FIG. 3, flowable composition 5 forms a layer over the face surface 2 of support structure 1. In preferred embodiments, flowable composition 5 is selected such that its viscosity and thixotropic properties will prevent flowable composition 5 from running off support structure 1. If the viscosity and/or the thixotropic properties of the flowable composition do not prevent the flowable composition from running off the support structure, means for containing the flowable composition on the support structure may be employed. Such means may include for example, an o-ring, a lip, a barrier or another sealing mechanism disposed around the periphery of the support structure.

Figure 4:
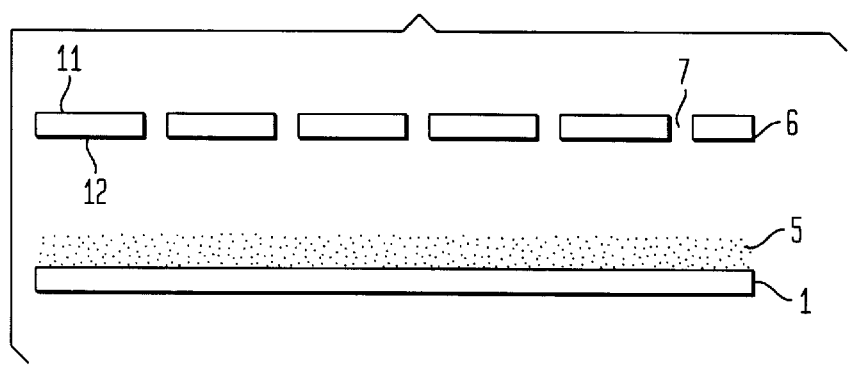
Figure 5:
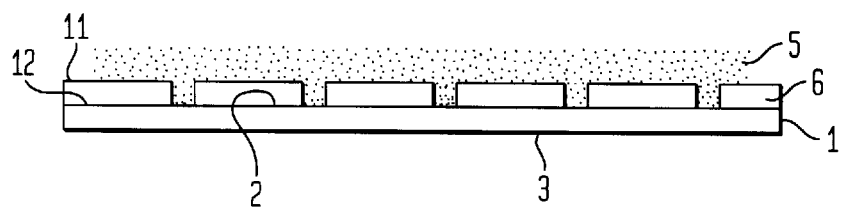

A sheet 6 having a top surface 11, a bottom surface 12 opposite the top surface and a plurality of apertures 7 is provided, as shown in FIG. 4. Sheet 6 and support structure 1 are aligned such that the bottom surface 12 of sheet 6 is disposed over the layer of flowable composition 5. As depicted in FIG. 5, support structure 1 and sheet 6 are forced together in order to force flowable composition 5 to flow into apertures 7. If the volume of flowable composition 5 exceeds the volume of the apertures, excess flowable composition may be forced onto the top surface 11 of sheet 6. Such excess flowable composition can removed, for example, by running a blade or a squeegee 8 over top surface 11, as depicted in FIGS. 6 and 7. This results in a plurality of masses of flowable composition 9 disposed in apertures 7. Sheet 6 may then be removed, as depicted in FIG. 8. Either before or after sheet 6 is removed, the plurality of masses of flowable composition 9 may be cured or at least partially cured to form a plurality of compliant pads 10. The flowable composition can be cured, for example, by exposing the flowable composition to heat or ultraviolet light. In preferred embodiments, the size and locations of each aperture 7 is selected such that the compliant pads formed are uniform, have diameters of from 200–3000 microns, and are arranged in a grid-like array. In preferred embodiments, any two adjacent pads will define a channel formed therebetween.

In an alternate method, the flowable composition may be cured or partially cured to form a plurality of compliant pads before the sheet is removed. The sheet may include a release coating or surface treatment to reduce the tendency of the compliant pads to adhere to the sheet. Such coating may include, for example, a silicone release coating or a synthetic, fluorine-containing resin commonly sold under the trade name TEFLON®. In preferred embodiments, when the compliant pads are comprised of a silicone elastomer, the release coating is comprised of a TEFLON® coating or another release coating other than a silicone release coating. In preferred embodiments, both the bottom surface 12 and apertures 7 of sheet 6 have a release coating. If the sheet is removed before the flowable composition is cured to an elastomer, the release coating is preferably made of a material to which the flowable composition will not adhere.

In another alternate method, the flowable composition described above can be replaced with a compressible or stampable material. Preferred compressible materials include silicone foams and polyurethane foams, closed cell silicone foams having high compression sets are particularly preferred.

The compliant interface of the present invention can be made in an automated process where the sheet referred to above is in the form of a continuous belt. FIG. 9 is a side view of an apparatus having such a continuous belt 103. Belt 103 may be capable of rotating in a clockwise direction, a counterclockwise direction or both. Belt 103 has a plurality of apertures 104. A support structure, as described above, is disposed on a conveyor 102. Conveyor 102 is capable of transporting support structure 101 along a path that is parallel to the direction of rotation of belt 103. A flowable composition 106 is dispensed onto the face surface of support structure 101. Conveyor 102 transports the support structure 101 to an area beneath belt 103. Belt 103 and support structure 101 are pressed together such that a portion of the outer surface of belt 103 is in contact with the face surface of support structure 101. The flowable composition 106 which is between belt 103 and support structure 101 will be forced into the apertures in the belt which are adjacent the support structure. If the volume of the flowable composition forced out from between belt 103 and support structure 101 is greater than the volume of the apertures into which it is forced, excess flowable composition may be forced onto the inner surface of belt 103 and will need to be removed. A blade or squeegee 105 can be wiped across the inner surface of belt 103 to remove such excess flowable composition. As belt 103 rotates and support structure 101 travels on the conveyor, a plurality of masses of flowable composition 108 will be formed. These masses can be cured or partially cured, using curing mechanism 107 to form a plurality of compliant pads 109 disposed on the support structure 101. The apertures in the belt are preferably sized and located such that the masses formed are uniform, have diameters between 300–2000 microns, and are arranged in a grid-like array. In preferred embodiments, each pair of adjacent pads will have a channel formed therebetween. In preferred embodiments, curing mechanism 107 is a heat source, an ultra-violet light source or a combination thereof. The compliant interface that results and which comprises a support structure and compliant pads, may in the form of individual strips or a roll. The strips or roll can be cut to any size that is convenient for use.

Simultaneous formation of compliant pads on the back and face surfaces of the support structure can also be accomplished. In preferred methods of simultaneous formation of compliant pads on both the back and face surfaces, the support structure and a pair of sheets or belts are oriented in a vertical position during formation of the pads rather than a horizontal position. If the support structure and sheets are oriented in a vertical position, the viscosity of the flowable composition should be high enough to prevent the flowable composition from running off the back and front faces of the support structure while the support structure is so oriented.

Figure 10:
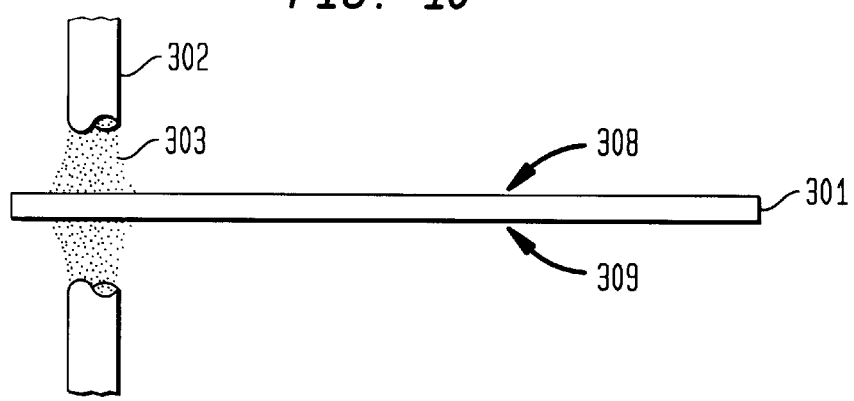
FIGS. 10–13 are side views of progressive steps in another embodiment of he method of the present invention.
Figure 11:
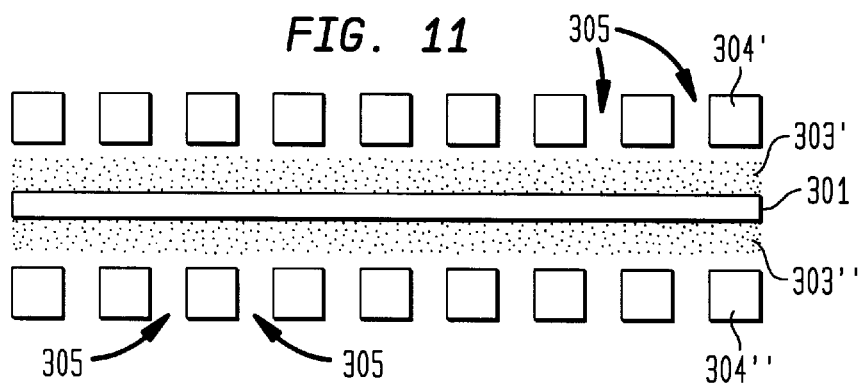
Figure 12:
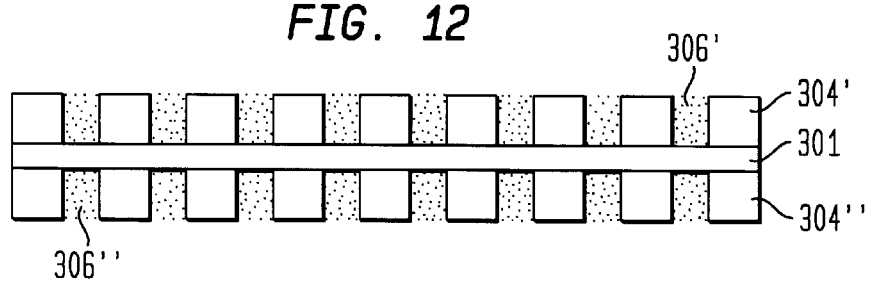
Figure 13:
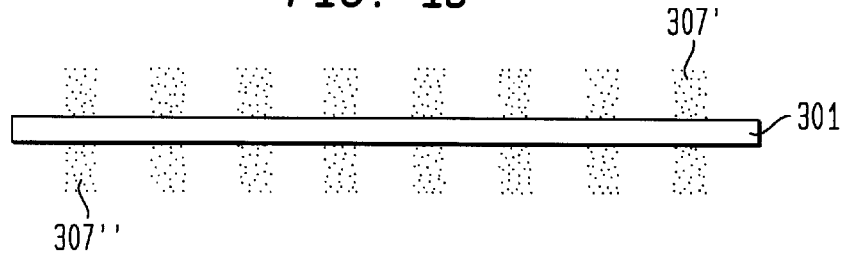

FIGS. 10–13 are side views of progressive steps in a method of forming a complaint interface having compliant pads on both the face and back surfaces. As depicted in FIG. 10, a support structure 301 having a face surface 308 and a back surface 309 opposite the face surface 308 is provided. When compliant pads are to be formed on both the face and back surfaces, support structure 301 is preferably a release layer or an elastomeric layer. In particularly preferred embodiments, support structure 301 is comprised of a release layer. The release layer may be comprised of a support element having a first release coating on one surface and a second release coating on the opposite surface. In an alternative embodiment, the release layer may include a release coating covering the entire exterior surface. The release layer should be comprised of a material to which the flowable composition, and more preferably the compliant pads, will not adhere. Flowable composition 303 is dispensed onto face surface 308 and back surface 309 to form a first layer of flowable composition 303' and a second layer of flowable composition 303". As shown in FIG. 11, a first sheet 304' is disposed over first layer 303'. A second sheet 304" is disposed over second layer 303". Both first sheet 304' and second sheet 304" have apertures 305. As depicted in FIG. 12, sheets 304' and 304" are forced against support structure 301 such that flowable composition from layers 303' and 303" is forced into apertures 305 and forms a plurality of first masses of flowable composition 306' and a plurality of second masses of flowable composition 306". As depicted in FIG. 13, sheets 304' and 304" are removed and masses 306' and 306" are cured or at least partially cured to form a plurality of first compliant pads 307' and a plurality of second compliant pads 307". Sheets 304' and 304" can be removed before or after curing the masses 306. In preferred embodiments, sheets 304' and 304" are removed prior to cure.

Figure 14:
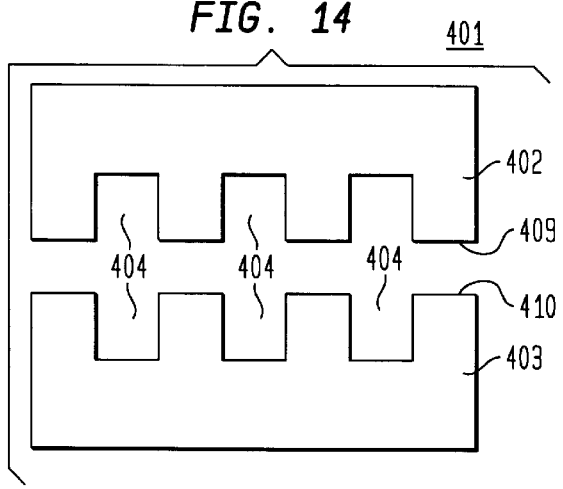
FIGS. 14–18 are side views of progressive steps in another embodiment of the method of the present invention.
Figure 15:
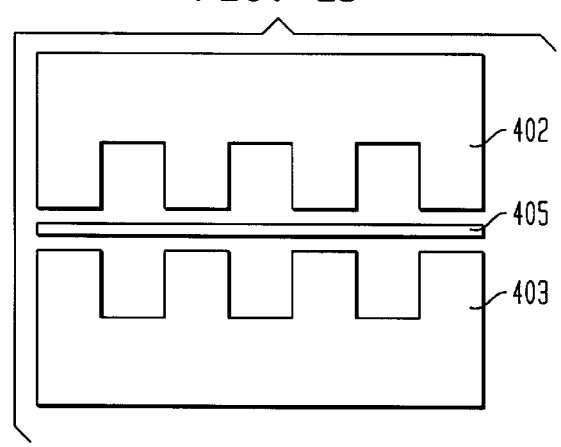
Figure 16:
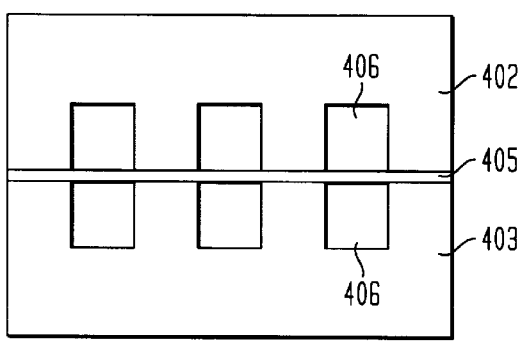
Figure 17:
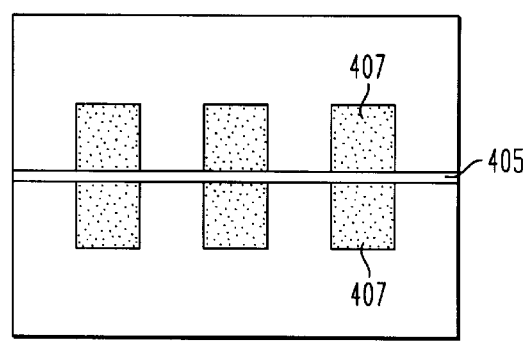
Figure 18:
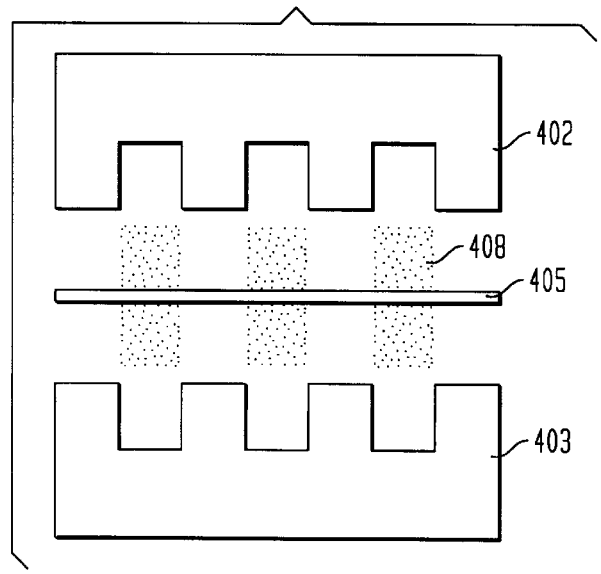

As depicted in FIGS. 14–18, which are side views of progress steps in another method of the present invention, a plurality of compliant pads may be made via an injection molding process. As depicted in FIG. 14, the apparatus used in FIGS. 11–13 to manufacture a plurality of compliant pads can be replaced by a mold. The mold may be a one-part or a two-part mold. The mold depicted in FIGS. 14–18 is a two-part mold. As depicted in FIG. 14, mold 401 has a top mold part 402 and a bottom mold part 403. Top mold part 402 and bottom mold part 403 have each have a plurality of indentations 404. As depicted in FIG. 15, a support structure 405 is disposed between top mold part 402 and bottom mold part 403. Top mold part 402 and bottom mold part 403 are forced together to form a plurality of chambers 406, as shown in FIG. 16. As depicted in FIG. 17, a flowable composition 407 is injected in each chamber 406 through one or more fill holes (not shown). Flowable composition 407 is cured or at least partially cured to form a plurality of compliant pads 408, as depicted in FIG. 18. Top mold 402 and bottom mold 403 are then separated and the support structure 405 with a plurality of compliant pads 408 is removed from the mold.

In another embodiment of the method described with reference to FIGS. 14–18, the bottom mold part of the mold may be free of indentations. When a curable flowable composition is dispensed into a mold having a bottom mold part which is free of indentations 404, the resulting compliant interface component will be comprised of a support structure having a plurality of compliant pads 408 disposed on one surface. The support structure may be a circuitized dielectric layer, a release layer or an elastomeric layer. If the support structure is a release layer, the compliant pads may be removed from the release layer and transferred to a circuited dielectric substrate for use as a complaint interface for a microelectronic package. If the support structure is an elastomeric layer, the compliant pads may be die cut from the compliant interface and then used as a compliant layer in a microelectronic package.

In alternative embodiment of the method described with reference to FIGS. 14–18, the support structure may be an elastomeric layer which is formed during the step in which the compliant pads are formed. In this method, a small gap remains between the top mold part 402 and bottom mold part 403 when the top mold part and the bottom mold part are forced together. The mold must include means for forming and sealing a chamber between the top and bottom mold parts when such mold parts are forced together. Such means may include one or more o-rings. After the chamber is formed, a flowable composition that is curable to an elastomer is dispensed into the chamber. The composition is cured or at least partially cured to form a compliant interface component for a microelectronic element. The compliant interface component comprises an elastomeric layer having a plurality of compliant pads disposed on both the top and bottom surfaces of such elastomeric layer.

In preferred embodiments, the flowable composition of the present invention is curable to an elastomeric polymer. Preferred elastomeric polymers include silicones and flexiblized epoxy resins. The flowable composition may be comprised of one part or may be comprised two or more parts which are mixed together. The flowable composition may cure upon mixing of the two or more part or may require an external energy source to cure to an elastomeric polymer. Preferred external energy sources are heat and ultra-violet light. The flowable composition may cure upon exposure to heat or ultraviolet light or may require both to achieve a complete cure. Preferred flowable compositions require heat to cure.

The support structure of the present invention may be substantially rigid, semi-rigid or flexible. In preferred embodiments, however, the support structure is a circuitized dielectric layer, a release layer or an elastomeric layer. The preferred circuitized dielectric layer is comprised of a flexible, but substantially inextensible dielectric film. Preferred dielectric films include polyimides such as, for example, Kapton™ "E" which is available from Du Pont Chemical. Polyimide films having a thickness of 25 to 75 microns are particularly preferred. Preferred circuitized dielectric layers include a plurality of electrically conductive terminals disposed on a surface. Such terminals are preferably located on the back surface of the dielectric film.

The sheet described in the present application is preferably a sheet of metal having a plurality of apertures. The thickness of the sheet and the diameter of the apertures should be selected such that the resulting compliant pads are of the desired dimensions. The height of the compliant pads, as measured from the base of the pad at the face surface of the support structure to the apexes of the pads, is preferably uniform. The ratio of width to height of each pad is preferably two to one (2:1) or greater in order to maintain good pad structural integrity. Each pad desirably has width or diameter, as measured at its juncture with the face surface of support structure, of from about 300 microns to about 2000 microns. The pads are preferably arranged in a grid pattern with center to center distance or "pitch" greater than the minimum width of each pad and preferably greater than the maximum width of each pad. Thus each pair of mutually adjacent pads defines a channel between them and all of the channels are preferably interconnected with one another to define a substantially continuous grid of channels.

If the support structure of the methods of the present invention is a circuitized dielectric layer, the complaint interface can be interconnected to a microelectronic element to form a microelectronic package. If the support structure is a release layer, the methods of the present invention can also be used to form a plurality of compliant pads on the release layer. The complaint pads so formed can be transferred to a circuitized dielectric substrate or a flexible interposer. The resulting assembly can then be interconnected to a microelectronic element to form a microelectronic package. The methods of the present invention can also be used to form a compliant interface for a semiconductor device if the support structure is an elastomeric layer. Such compliant interfaces can be used to microelectronic packages such as for example, the packages described in commonly assigned U.S. Pat. Nos. 5,148,265, 5,148,266, 5,477,611, 5,548,091, 5,663,106, and 5,659,952, and U.S. patent applications with Ser. No. 08/987,720 (filed on Dec. 9, 1997); Ser. No. 08/879,922 (filed on Jun. 20, 1997); Ser. No. 08/842,313 (filed on Apr. 24, 1997); and Ser. No. 08/931,680 (filed on Sep. 16, 1997); the specifications of which are hereby incorporated herein by reference. If the compliant interface will be stored before being used to fabricate a microelectronic package, it may be desirable to place a storage liner over the compliant pads. If the complaint interface includes compliant pads disposed on both the face and back surfaces, it may be desirable to place a first storage liner over the plurality of first pads and a second storage liner over the plurality of second compliant pads. The storage liners may be used before the compliant pads are cured by placing such liners over the masses of flowable composition.

As these and other variations and combinations of the features discussed above can be utilized without departing from the present invention as defined by the claims, the foregoing description of the preferred embodiments should be taken by way of illustration rather than by way of limitation of the claimed invention.

What is claimed is:

1. A method of making a compliant interface for a microelectronic package, comprising:
   providing a support structure having a face surface;
   disposing a flowable composition on the face surface;
   disposing a bottom surface having a plurality of first apertures over the first layer; and
   forming a plurality of first masses of flowable composition disposed on the face surface of the support structure by forcing flowable composition through the first apertures.

2. The method of claim 1, wherein the bottom surface comprises a bottom surface of a first sheet, the first sheet has a top surface, and further comprising:
   removing excess flowable composition from the top surface of the first sheet.

3. The method of claim 2, wherein the flowable composition comprises a curable flowable composition and further comprising:
   moving the bottom surface of the first sheet away from the face surface of the support structure; and
   curing the plurality of first masses to form a plurality of first compliant pads.

4. The method of claim 3, wherein each of the first compliant pads has a diameter of 300 to 2000 microns.

5. The method of claim 3, further comprising:
   disposing a first storage liner over the plurality of first compliant pads.

6. The method of claim 3, further comprising:
   disposing a first storage liner over the plurality of first masses prior to curing.

7. The method of claim 2, wherein the first sheet comprises a continuous belt.

8. The method of claim 1, wherein the bottom surface comprises a bottom surface of a first sheet, the support structure has a back surface opposite the face surface, and wherein the method further comprises:
   disposing a flowable composition on the back surface of the support structure to form a second layer of flowable composition;
   disposing a top surface of a second sheet having a plurality of second apertures adjacent the second layer; and
   moving the top surface of the second sheet toward the back surface of the support structure and forming a plurality of second masses of flowable composition disposed on the back surface of the support structure by forcing flowable composition through the second apertures.

9. The method of claim 8, wherein the second sheet has a bottom surface and further comprising:
   removing excess flowable composition from the bottom surface of the second sheet.

10. The method of claim 8, wherein the flowable composition comprises a curable flowable composition and further comprising:
    moving the bottom surface of the first sheet away from the face surface of the support structure and the top surface of the second sheet away from the back surface of the support structure; and
    curing the plurality of first masses to form a plurality of first compliant pads and curing the plurality of second masses to form a plurality of second compliant pads.

11. The method of claim 10, further comprising:
    disposing a first storage liner over the plurality of first compliant pads; and
    disposing a second storage liner over the plurality of second compliant pads.

12. The method of claim 10, further comprising:
    disposing a first storage liner over the plurality of first masses prior to curing; and
    disposing a second storage liner over the plurality of second masses prior to curing.

13. The method of claim 1, wherein the bottom surface comprises a bottom surface of a first sheet and the first sheet has a release coating disposed on the bottom surface.

14. The method of claim 13, wherein each of the first apertures is defined by a first sidewall which is coated with a release coating.

15. The method of claim 8, wherein the first sheet has a release coating disposed on the bottom surface and the second sheet has a release coating disposed on the top surface.

16. The method of claim 15, wherein each of the first apertures is defined by a first sidewall which is coated with a release coating, and each of the second apertures is defined by a second sidewall which is coated with a release coating.

17. The method of claim 3, wherein the support structure includes a circuitized dielectric layer.

18. The method of claim 17, wherein the circuitized dielectric layer comprises:
    a dielectric layer;
    a plurality of electrically conductive terminals disposed on the dielectric layer; and
    an electrically conductive lead extending from each terminal.

19. The method of claim 3, wherein the support structure includes a release layer having a first release coating disposed on the face surface.

20. The method of claim 1, wherein the flowable composition is a stampable or compressible material.

21. The method of claim 20, wherein the flowable composition comprises a foam.

22. The method of claim 21, wherein the foam is a silicone foam.

23. The method of claim 1, wherein the step of disposing a bottom surface comprises
    disposing a bottom surface of a first mold part adjacent to the face surface of the support structure, wherein the first mold part has a plurality of first indentations extending from the bottom surface and the step of forming a plurality of first masses comprises
disposing a flowable composition in each of the first indentations and forming a plurality of first masses of flowable composition disposed on the face surface of the support structure.

24. The method of claim 23, further comprising:
curing the plurality of first masses to form a plurality first compliant pads.

25. The method of claim 24, further comprising curing the first masses and then moving away the bottom surface of the first mold part from the face surface of the support structure.

26. The method of claim 23, wherein the support structure has a back surface opposite the face surface and the method further comprises:
disposing a top surface of a second mold part adjacent to the back surface of the support structure, wherein the second mold part has a plurality of second indentations extending from the top surface;
disposing a flowable composition in each of the second indentations to form a plurality of second masses disposed on the back surface of the support structure; and
moving the top surface of the second mold part away from the back surface of the support structure.

27. The method of claim 26, further comprising:
curing the plurality of second masses to form a plurality second compliant pads.

28. The method of claim 23, wherein the support structure includes a circuitized dielectric layer.

29. The method of claim 28, wherein the a circuitized dielectric layer comprises:
a dielectric layer;
a plurality of electrically conductive terminals disposed on the dielectric layer; and
an electrically conductive lead extending from each terminal.

30. The method of claim 23, wherein the support structure includes a release layer having a first release coating disposed on the face surface.

31. The method of claim 23, wherein the support structure comprises an elastomer layer.

32. The method of claim 23, wherein the step of disposing a bottom surface of a first mold part is performed so that the bottom surface is spaced apart from the face surface of the support structure to create a gap between the bottom surface of the first mold part and the face surface of the support structure, wherein the flowable composition is curable to an elastomer; and wherein the step of disposing a flowable composition is performed so that flowable composition is disposed in each of the first indentations and in the gap to form a plurality of first masses of flowable composition disposed on a layer of flowable composition.

33. The method of claim 32, further comprising:
curing the plurality of first masses and the layer of flowable composition to form a plurality first compliant pads disposed on an elastomeric layer.

34. A method of making a microelectronic packaging having a compliant interface, comprising:
providing a compliant interface made according to the method of claim 19;
providing a circuitized dielectric substrate comprising:
a dielectric layer having a first surface;
a plurality of electrically conductive leads, wherein each of the leads has a tip end and a terminal end, the terminal end of each lead being permanently connected to the dielectric layer;
and an electrically conductive terminal electrically connected to each terminal end;
transferring the plurality of first compliant pads from the release layer to the first surface of the dielectric layer; and
juxtaposing a microelectronic element having a plurality of electrically conductive contacts to the first surface of the dielectric layer and;
electrically interconnecting the microelectronic element to the dielectric layer by connecting the tip end of each lead to one of the contacts on the microelectronic element.

35. The method of claim 34, further comprising:
vertically extending each lead by moving the microelectronic element and the dielectric layer away from one another.

36. The method of claim 35, further comprising disposing an encapsulant composition between the microelectronic element and the dielectric layer.

37. The method of claim 36, wherein the microelectronic element is a semiconductor chip.

38. The method of claim 37, wherein the microelectronic element is a wafer.

39. A method of making a microelectronic packaging having a compliant interface, comprising:
providing a compliant interface made according to the method of claim 18;
providing a microelectronic element having a plurality of electrically conductive contacts; and
electrically interconnecting the microelectronic element to the dielectric layer by connecting each lead to one of the contacts on the microelectronic element.

40. The method of claim 39, further comprising:
vertically extending each lead by moving the microelectronic element and the dielectric layer vertically away from one another.

41. The method of claim 40, further comprising:
disposing an encapsulant composition between the microelectronic element and the dielectric layer.

42. The method of claim 41, wherein the microelectronic element is a semiconductor chip.

43. The method of claim 41, wherein the microelectronic element is a wafer.

* * * * *

UNITED STATES PATENT AND TRADEMARK OFFICE
CERTIFICATE OF CORRECTION

PATENT NO. : 6,300,254 B1  
DATED : October 9, 2001  
INVENTOR(S) : Kurt Raab

Page 1 of 1

It is certified that error appears in the above-identified patent and that said Letters Patent is hereby corrected as shown below:

Column 1,  
Line 32, "result" should read -- results --

Column 6,  
Line 13, "comprised two" should read -- comprised of two --  
Line 15, "part" should read -- parts --

Column 9,  
Line 9, "plurality first" should read -- plurality of first --  
Line 30, "second" should read -- of second --  
Line 33, "the a circuitized" should read -- the circuitized --  
Line 59, "plurality first" should read -- plurality of first --

Signed and Sealed this

Seventh Day of May, 2002

Attest:

*Attesting Officer*

JAMES E. ROGAN  
*Director of the United States Patent and Trademark Office*